(12) United States Patent
Yagi

(10) Patent No.: US 7,892,948 B2
(45) Date of Patent: Feb. 22, 2011

(54) METHOD FOR MANUFACTURING SOI WAFER AND SOI WAFER

(75) Inventor: Shinichiro Yagi, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 18 days.

(21) Appl. No.: 12/223,026

(22) PCT Filed: Jan. 15, 2007

(86) PCT No.: PCT/JP2007/050391

§ 371 (c)(1),
(2), (4) Date: Jul. 21, 2008

(87) PCT Pub. No.: WO2007/083587

PCT Pub. Date: Jul. 26, 2007

(65) Prior Publication Data

US 2009/0042364 A1 Feb. 12, 2009

(30) Foreign Application Priority Data

Jan. 23, 2006 (JP) .............................. 2006-013558

(51) Int. Cl.
*H01L 21/30* (2006.01)
*H01L 21/46* (2006.01)
*H01L 21/76* (2006.01)

(52) U.S. Cl. .............................. 438/459; 257/E21.568; 257/E25.029; 438/406; 438/412; 438/424

(58) Field of Classification Search .......... 257/E21.568, 257/E25.029; 438/459, 406, 415, 424

See application file for complete search history.

(56) References Cited

U.S. PATENT DOCUMENTS 5,882,468 A * 3/1999 Crockett et al. .......... 156/345.3

(Continued)

FOREIGN PATENT DOCUMENTS

JP A-05-160074 6/1993

(Continued)

OTHER PUBLICATIONS

Colinge, Jean-Pierre; ("Siicon-on-Insulator Technolgy : materials to VLSI", 1997, Kluwer Academic Publishers, 2nd edition, p. 72.*

(Continued)

*Primary Examiner*—David S Blum
(74) *Attorney, Agent, or Firm*—Oliff & Berridge, PLC

(57) ABSTRACT

The present invention provides a method for manufacturing an SOI wafer in which a thickness of an SOI layer is increased by growing an epitaxial layer on the SOI layer of the SOI wafer having an oxide film and the SOI layer formed on a base wafer, wherein the epitaxial growth is performed in such a manner that a reflectivity of a surface of the SOI wafer on which the epitaxial layer is grown in a wavelength region of a heating light at the start of the epitaxial growth falls within the range of 30% to 80%. As a result, in the method for manufacturing the SOI wafer in which a thickness of the SOI layer is increased by growing the epitaxial layer on the SOI layer of the SOI wafer having the oxide film and the SOI layer formed on the base wafer, a method for manufacturing a high-quality SOI wafer with less slip dislocation and others is provided.

2 Claims, 3 Drawing Sheets

U.S. PATENT DOCUMENTS

| | | | |
|---|---|---|---|
| 6,800,833 B2 * | 10/2004 | Gregor et al. | 219/390 |
| 6,864,463 B2 * | 3/2005 | Ikeda | 219/390 |
| 7,199,026 B2 * | 4/2007 | Ohkawa | 438/463 |
| 2001/0046746 A1 * | 11/2001 | Yokokawa et al. | 438/311 |
| 2005/0009252 A1 | 1/2005 | Yamazaki et al. | |
| 2006/0201927 A1 * | 9/2006 | Gat et al. | 219/390 |

FOREIGN PATENT DOCUMENTS

| | | |
|---|---|---|
| JP | A-05-211128 | 8/1993 |
| JP | A-2001-085649 | 3/2001 |
| JP | B2-3358550 | 10/2002 |

OTHER PUBLICATIONS

Pejnefors et al., "Effects of Growth Kinetics and Surface Emissivity on a Chemical Vapor Deposition of Silicon in a Lamp-Heated Single-Wafer Reactor," *Electrochemical and Solid-State Letters*, vol. 4, No. 11, Nov. 2001, pp. G98-G100.

Extended European Search Report issued in European Patent Application No. 07713606.7 on Aug. 23, 2010.

\* cited by examiner

[Fig. 1]
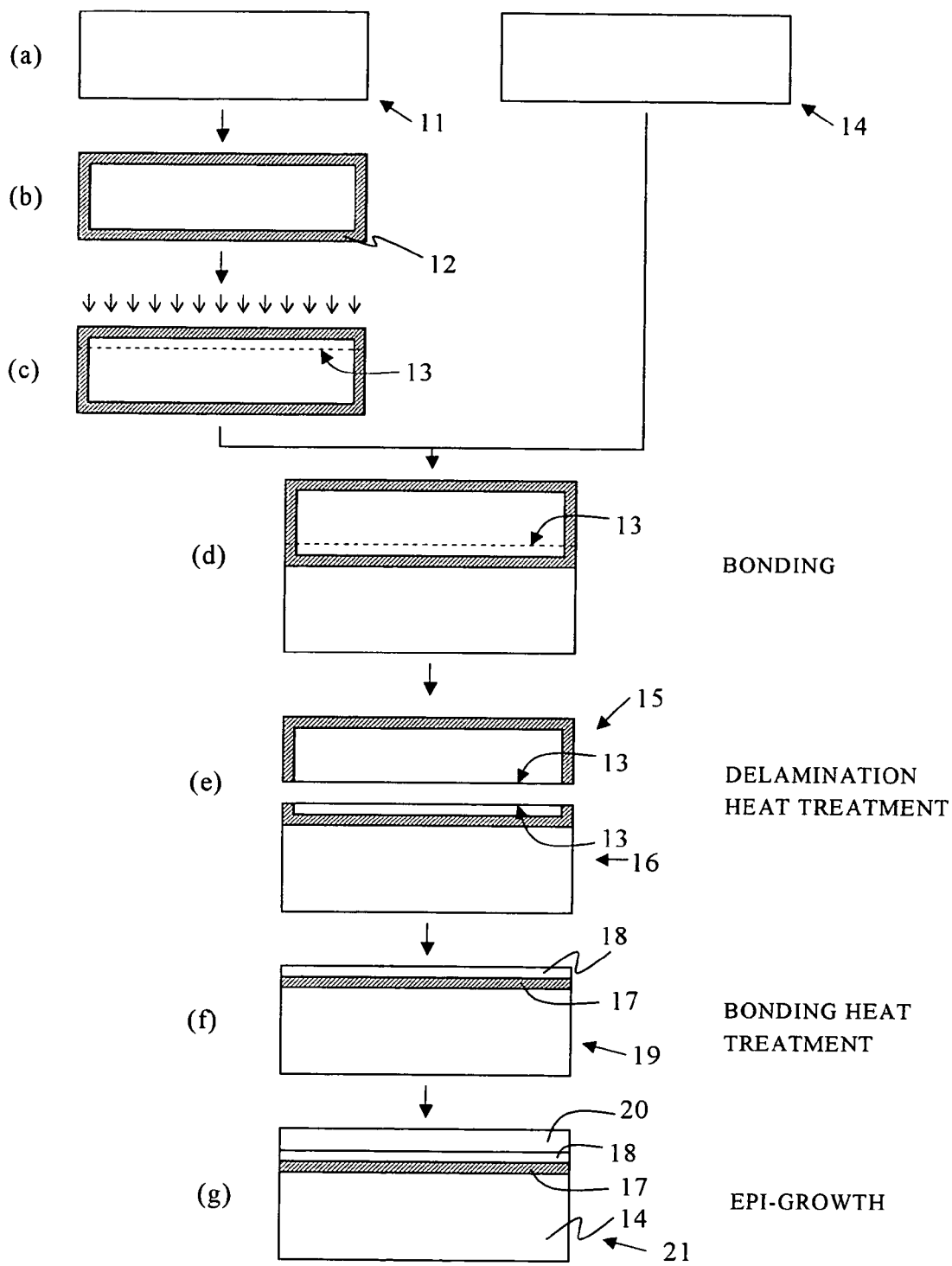

[Fig. 2]
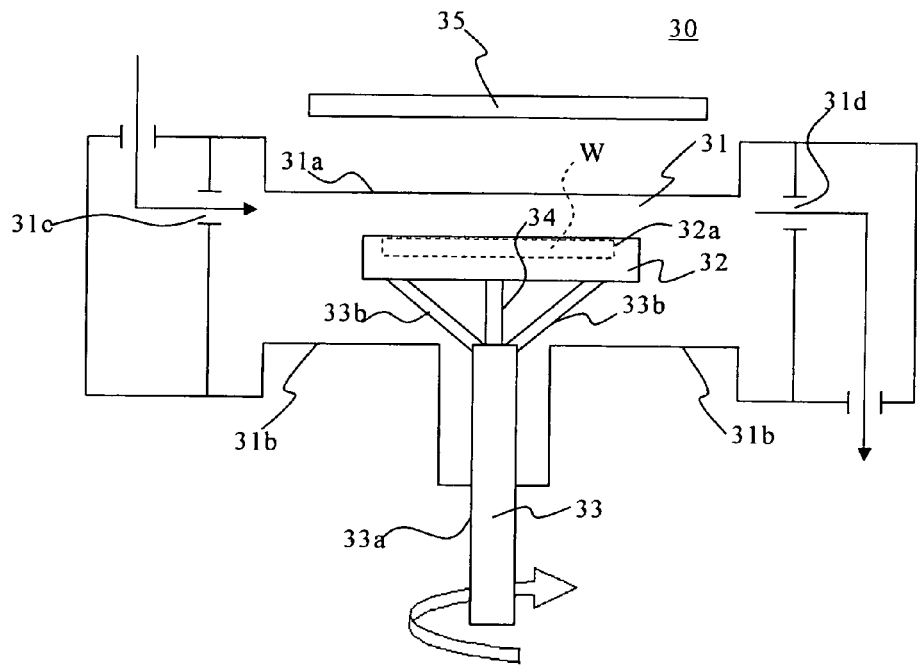
[Fig. 3]
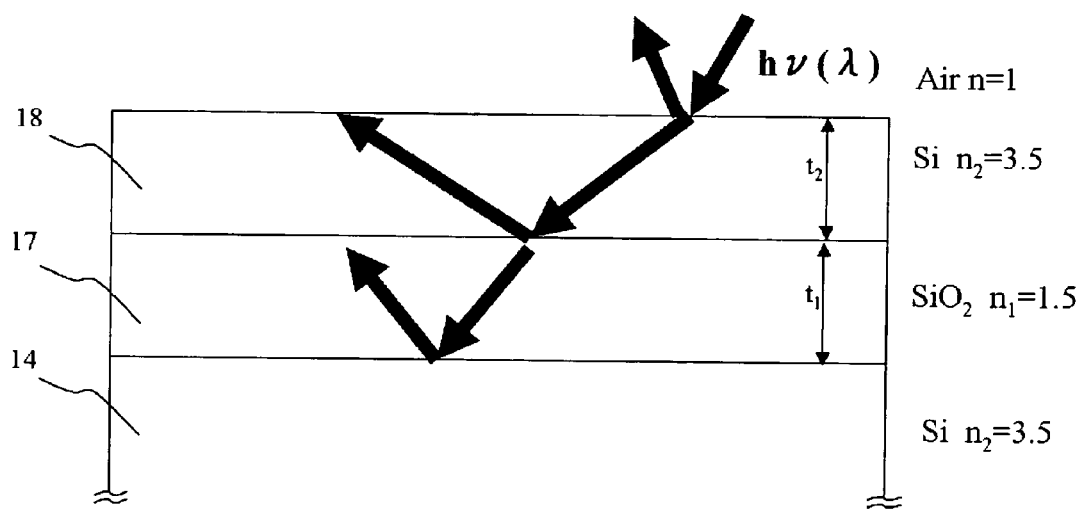

[Fig. 4]
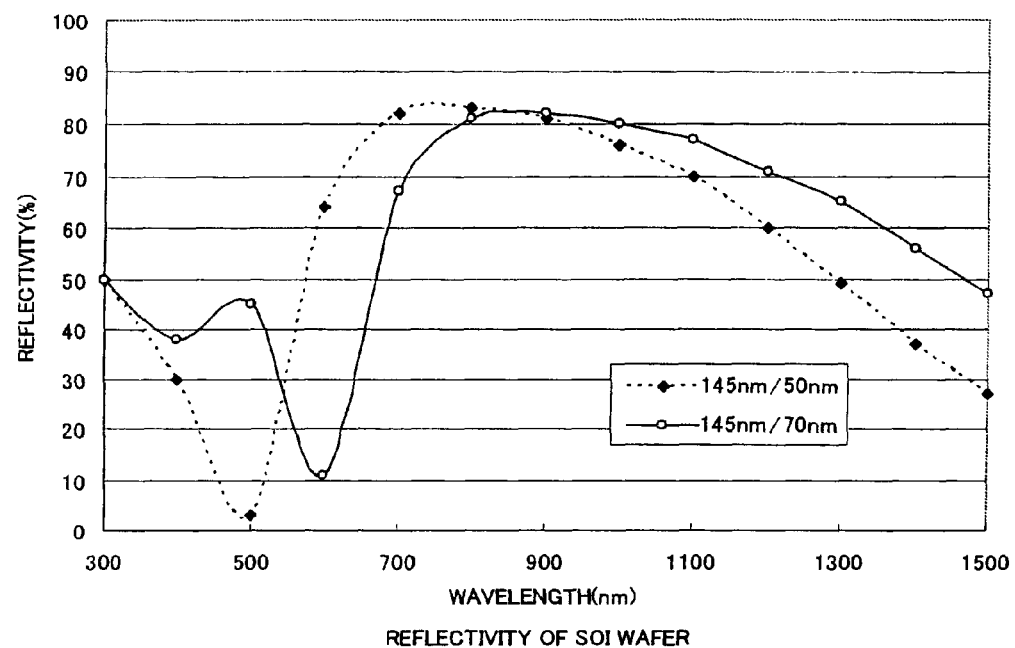
REFLECTIVITY OF SOI WAFER
[Fig. 5]
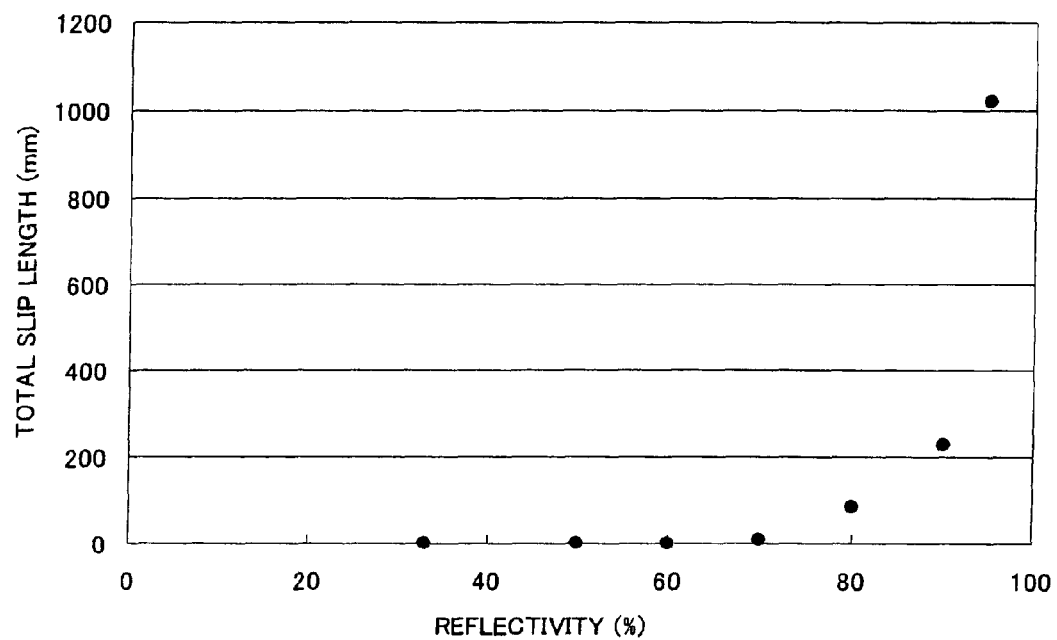

METHOD FOR MANUFACTURING SOI WAFER AND SOI WAFER

TECHNICAL FIELD

The present invention relates to a method for manufacturing an SOI wafer in which a thickness of an SOI layer is increased by subjecting a semiconductor single crystal film to the epitaxial growth on the SOI wafer serving as a substrate.

BACKGROUND ART

As a semiconductor substrate for a high-performance device, a bonded substrate obtained by bonding a bond wafer to a base wafer and then reducing a film thickness of the bond wafer is used. As one of such bonded substrates, an SOI substrate formed of silicon is known.

As a method for manufacturing an SOI substrate, the following bonding method is known, for example. That is, two mirror-polished silicon wafers (a bond wafer and a base wafer) are prepared, and an oxide film is formed on at least one of the wafers. Further, these wafers are bonded to each other through the oxide film, and then a heat treatment is performed to increase bonding strength. Thereafter, a film thickness of the bond wafer is reduced to obtain an SOI substrate on which an SOI (Silicon on Insulator) layer is formed. As a method for reducing this film thickness, the film thickness of the bond wafer is reduced to some extent based on grinding or etching, and then a surface thereof is subjected to mechanochemical polishing, thereby finishing the wafer with a desired SOI layer thickness.

Although the SOI wafer manufactured by this method has a merit that crystallinity of the SOI layer or reliability of the oxide film is as high as that of a regular semiconductor wafer, this manufacturing method has a drawback that there is a limit in uniformity of a film thickness of the SOI layer and radial uniformity of at most approximately 0.3 µm can be obtained with respect to a target film thickness even though a highly accurate machining technique is adopted. Furthermore, only one SOI wafer can be obtained from two semiconductor wafers, resulting in a problem of an increase in cost.

Japanese Patent Application Laid-open No. H5-211128 has recently proposed a method for bonding an ion implanted wafer to another wafer and then performing a heat treatment to carry out delamination at an ion implanted layer, i.e., a so-called an ion implantation delamination method as a new method for manufacturing an SOI wafer. This method is a technology of forming an oxide film on at least one of two silicon wafers, implanting a hydrogen ion or a rare gas ion from main surface of a bond wafer, forming a micro bubble layer (an ion implanted layer) in the wafer, then closely contacting the ion implanted surface with a base wafer through the oxide film, performing a heat treatment (a delamination heat treatment) to delaminate the bond wafer in a thin film with the micro bubble layer being used as a cleavage plane, and further performing a heat treatment (a bonding heat treatment) to firmly bond the wafers in some cases, thereby obtaining an SOI wafer.

According to this method, an SOI wafer having film thickness uniformity of ±0.01 µm can be relatively easily obtained.

Meanwhile, an SOI wafer in which an SOI layer has a relatively large film thickness of several µm to several-ten µm is very useful for a bipolar device or a power device, and its future development is greatly expected. When manufacturing an SOI wafer having such a relatively large film thickness in a conventional technology, a bond wafer is first bonded to a base wafer through an oxide film based on the bonding method, a bonding heat treatment is performed at approximately 1100° C., and then grinding and polishing processes are carried out to manufacture the SOI wafer having a desired film thickness. However, at this case, since an unbonded portion is produced at a wafer peripheral portion, an edge machining process for removing the unbonded portion must be performed before polishing, thereby resulting in a problem of a complicated process or an increase in cost. Moreover, the polishing process alone cannot improve uniformity of the film thickness of the SOI layer as explained above, and a vapor phase etching process called a PACE (Plasma Assisted Chemical Etching) method disclosed in Japanese Patent Application Laid-open No. H5-160074 is used to uniform the film thickness and haze and others are removed based on mirror polishing. However, there is a drawback that performing polishing after vapor phase etching in this manner degrades uniformity of the film thickness of the SOI layer to introduce a latent scratch or a damaged layer and crystallinity is apt to be degraded, and a cost is still high.

On the other hand, the ion implantation delamination method has a great merit in terms of productivity or a cost since the edge machining process that is necessary in the wafer bonding method is not required. However, since an acceleration voltage of an ion implantation apparatus determines an implantation depth of an ion and this further determines a film thickness of the SOI layer, an acceleration voltage of approximately 20 keV is a limit in a large-current ion implantation apparatus that is usually utilized as a mass-produced apparatus because of a restriction in the apparatus, and hence only an SOI layer having a film thickness of at most approximately 2 µm can be fabricated. Therefore, in order to form an SOI layer having a larger film thickness based on the ion implantation delamination method, although the large-current ion implantation apparatus that can obtain a higher acceleration voltage is required, obtaining a large current is difficult in the apparatus that can obtain a high acceleration voltage exceeding 200 keV, a time to obtain a predetermined implantation amount is required and this leads to an increase in cost, and hence a practical application on a mass production level is not realized. Additionally, the same problem as that of the PACE method is present in a point that a process, e.g., polishing is required to improve surface roughness of an SOI surface after delamination.

To solve the above-explained problem, Japanese Patent No. 3358550 discloses a method for manufacturing an SOI wafer by forming an oxide film on at least one of a bond wafer and a base wafer, implanting a hydrogen ion or a rare gas ion from a main surface of the bond wafer to form an ion implanted layer, then closely contacting the ion implanted surface with the base wafer through the oxide film, applying a heat treatment, separating the bond wafer in a thin film while using the ion implanted layer as a cleavage plane (a delamination surface) to fabricate an SOI wafer (an SOI wafer serving as a substrate) having an SOI layer, and then growing an epitaxial layer on the SOI layer to form an SOI layer having a relatively large film thickness.

However, when performing the epitaxial growth at a high temperature by using a lamp heating type epitaxial growth apparatus on the SOI layer of the SOI wafer serving as a substrate based on the above-explained method, there is a problem that slip dislocation and others are apt to occur on the wafer to degrade a quality of the SOI wafer, and this must be improved.

DISCLOSURE OF INVENTION

Therefore, in view of the above-explained problems, it is an object of the present invention to provide a method for manufacturing an SOI wafer that is a method for manufacturing a high-quality SOI wafer with less slip dislocation and others in which a thickness of an SOI layer is increased by growing an epitaxial layer on the SOI layer of the SOI wafer having an oxide film and the SOI layer formed on a base wafer.

To achieve this object, the present invention provides a method for manufacturing an SOI wafer in which a thickness of an SOI layer is increased by growing an epitaxial layer on the SOI layer of the SOI wafer having an oxide film and the SOI layer formed on a base wafer, wherein the epitaxial growth is performed in such a manner that a reflectivity of a surface of the SOI wafer on which the epitaxial layer is grown in a wavelength region of a heating light at the start of the epitaxial growth falls within the range of 30% to 80%.

In the method for manufacturing an SOI wafer in which a thickness of the SOI layer is increased by growing the epitaxial layer on the SOI layer of the SOI wafer having the oxide film and the SOI layer formed on the base wafer, since setting the reflectivity on the surface of the SOI wafer for the heating lamp light to the range of 30% to 80% enables efficiently performing absorption of an energy of the heating lamp light on the surface of the SOI wafer, a temperature distribution in the SOI wafer can be further uniformed, and occurrence of slip dislocation and others can be suppressed. Therefore, the high-quality SOI wafer with less slip dislocation and others can be efficiently obtained, thereby improving productivity.

Further, according to the present invention, the reflectivity of the surface of the SOI wafer on which the epitaxial layer is grown can be set to fall within the range of 30% to 80% by adjusting a thickness of the oxide film and a thickness of the SOI layer, respectively.

The reflectivity on the surface of the SOI wafer having the SOI layer with a small film thickness may be greatly contributed by formation of a one-dimensional photonic bandgap structure including the oxide film and the SOI layer in some cases. Thus, respectively adjusting the thicknesses of the oxide film and the SOI layer of the SOI wafer on which the epitaxial layer is grown enables setting the reflectivity of the surface of the SOI wafer to fall within the range of 30% to 80%.

Furthermore, according to the present invention, the SOI wafer on which the epitaxial layer is grown can be fabricated by ion-implanting a hydrogen ion, a rare gas ion, or a mixed gas ion containing these ions from a surface of a bond wafer to form an ion implanted layer in the wafer, closely contacting an ion implanted surface of the bond wafer with a surface of the base wafer through the oxide film, and then performing a heat treatment to delaminate the bond wafer in a thin film with the ion implanted layer being used as a cleavage plane.

An effect of the present invention is particularly prominent when fabricating the SOI wafer serving as a substrate on which an epitaxial layer is grown based on the ion implantation delamination method. That is because, in the SOI wafer serving as a substrate fabricated based on the ion implantation delamination method, a thickness of the SOI layer is approximately 2 μm at a maximum, and conditions for intensifying reflection on the surface can be readily satisfied. Moreover, the SOI wafer serving as a substrate fabricated based on the ion implantation delamination method has high film thickness uniformity of the SOI layer, and performing the epitaxial growth on such an SOI layer enables manufacturing the SOI wafer with a large film thickness in which a film thickness of the SOI layer is uniform.

The SOI wafer manufactured by the above-explained method for manufacturing an SOI wafer is a high-quality SOI wafer that has less slip dislocation and others and has a thick-film SOI layer having high film thickness uniformity.

Like the present invention, in the method for manufacturing an SOI wafer in which a thickness of an SOI layer is increased by growing an epitaxial layer on the SOI layer of the SOI wafer having an oxide film and the SOI layer formed on a base wafer, when the epitaxial growth is performed in such a manner that a reflectivity of a surface of the SOI wafer where the epitaxial layer is grown in a wavelength region of a heating light at the time of start of the epitaxial growth is set to the range of 30% to 80%, a temperature distribution in the wafer can be further uniformed, thereby suppressing occurrence of slip dislocation and others. Therefore, the high-quality thick-film SOI wafer having less slip dislocation and others can be efficiently manufactured.

BRIEF DESCRIPTION OF DRAWINGS

FIG. 1 is an explanatory drawing showing a process for manufacturing an SOI wafer by growing an epitaxial layer on an SOI layer of the SOI wafer to increase a thickness of the SOI layer;

FIG. 2 is a schematic structural drawing of a single-wafer processing type vapor phase epitaxial growth apparatus that can be used in the present invention;

FIG. 3 is a view schematically showing a state of reflection of a light on an SOI layer side based on formation of a photonic bandgap structure;

FIG. 4 is a graph showing a result obtained by measuring a reflectivity of the SOI wafer; and FIG. 5 is a graph showing a relationship between a reflectivity of the SOI wafer before the epitaxial growth and a total slip length after the epitaxial growth.

BEST MODE(S) FOR CARRYING OUT THE INVENTION

The present inventor has repeatedly examined a problem that slip dislocation and others are apt to occur when growing an epitaxial layer on an SOI layer of an SOI wafer serving as a substrate. In the examinations, the present inventor has paid attention to a fact that a later-explained one-dimensional photonic bandgap structure is formed and a reflectivity for a heating light spectrum to be applied is extremely increased when an oxide film and the SOI layer having different refractive indices satisfy a specific layer thickness relationship at the time of start of the epitaxial growth. Additionally, it has considered that heating of the SOI wafer based on heating light irradiation becomes non-uniform due to reflection characteristics derived from an optical structure of the oxide film and the SOI layer, which leads to occurrence of slip dislocation and others.

Then, the present inventor has revealed that, when a laminated portion of the oxide film and the SOI layer forms a one-dimensional photonic bandgap structure in specific wavelength regions to produce intensive reflection, appropriately adjusting a layer thickness relationship enables greatly suppressing this reflection.

Further, as a result of a keen examination, the present inventor has discovered that a spectrum of a heating light used for the epitaxial growth usually has an intensity peak in a wavelength region of approximately 1.0 μm, and adjusting a layer thickness relationship between the oxide film and the SOI layer so that a reflectivity demonstrated by the laminated portion of the oxide film and the SOI layer for a light in this wavelength region becomes smaller, or more specifically adjusting a thickness t1 of the oxide film and a thickness t2 of the SOI layer of the SOI wafer serving as a substrate before performing the epitaxial growth in such a manner that a reflectivity on the surface in this wavelength region becomes 80% or below, or preferably 70% or below allows a wavelength component contributing to heating from a light source to be efficiently absorbed into the SOI wafer, thereby very effectively suppressing occurrence of slip dislocation and others involved by heating when growing the epitaxial layer.

The present invention will now be explained hereinafter in more detail.

As a result of minutely examining a relationship between conditions when performing the epitaxial growth on an SOI layer of an SOI wafer serving as a substrate and occurrence of slip dislocation and others on the wafer, the present inventor has grasped the following facts.

(1) When performing the epitaxial growth on the SOI layer of the SOI wafer serving as a substrate, slip dislocation and others are apt to occur in some cases. Specifically, this corresponds to a case where the SOI wafer is heated based on light irradiation from the SOI layer side.

(2) Occurrence of slip dislocation and others is prominent when a wavelength of a heating light to be applied (which is represented as a peak wavelength λ hereinafter) and an optical thickness tOP of an oxide film and an the SOI layer in the wavelength region satisfy a fixed relationship, and occurrence of slip dislocation and others is particularly prominent when a relationship close to tOP=0.5 λ is satisfied at the time of start of the epitaxial growth.

A cause that slip dislocation and others are apt to occur when the condition (2) is satisfied at the time of heating light irradiation when performing the epitaxial growth can be considered as follows.

As light reflection on an SOI layer surface, total reflection derived from a difference in refractive index between an ambient atmosphere (e.g., air) and the SOI layer can be considered, but this occurs only when an incidence angle of a light is greater than a fixed critical angle, and this is not a serious problem when an entire surface of the SOI wafer can be uniformly irradiated with the heating light from a radially wide light source. However, when the oxide film and the SOI layer having greatly different refractive indices are combined, very intensive reflection may occur depending on a relationship between a layer thickness and a wavelength of an incident light even though an incidence direction of the light is close to a radial normal direction.

For example, it is known that a band structure similar to an electron energy in a crystal with respect to an optically quantized electromagnetic wave energy is formed in a layer thickness direction of a laminated body whose refractive index cyclically varies and an electromagnetic wave having a specific wavelength associated with the cycle of a change in refractive index is prevented from entering the structure of the laminated body like a structure in which a silicon oxide film and a silicon layer are alternately laminated. Such a structure is called a photonic band structure and, since a refractive index varies in a layer thickness direction alone in case of a multilayer film, this structure is also called a one-dimensional photonic bandgap structure in the narrow sense.

Such a photonic bandgap structure has a tendency that an incidence prohibited wavelength region (i.e., a reflectivity increasing wavelength region: which will be referred to as a photonic bandgap region hereinafter) becomes wide when a lamination cycle number is increased, but the photonic bandgap region is relatively narrowed even though the lamination cycle number is 1, and very large reflection still occurs near a gap central wavelength. A typical SOI wafer structure, i.e., a structure of the laminated portion in which the oxide film and the SOI layer are formed one by one on the base wafer corresponds to this structure, and a condition for generation of the one-dimensional photonic bandgap structure is that an optical thickness tOP=n1×t1+n2×t2 of the oxide film and the SOI layer in an incident light wavelength region satisfies ½ of a wavelength λ of an incident light where n1 is a refractive index of the oxide film in the wavelength region and n2 is a refractive index of the SOI layer in the wavelength region. At this time, forming such a one-dimensional photonic bandgap structure as depicted in FIG. 3 provokes occurrence of strong reflection of a heating light hv on an SOI layer 18 side. In particular, when a ratio of optical thicknesses of the oxide film and the SOI layer (t1×n1)/(t2×n2) is close to 1 (i.e., when the optical thicknesses of both the layers are equal to each other), a wavelength region where strong reflection occurs becomes widest, and a reflectivity is also increased. It is to be noted that the refractive index n1 of the oxide film in an infrared wavelength region is 1.5 in case of a silicon oxide film, whilst the refractive index n2 of the SOI layer is 3.5 in case of silicon single crystal and 4.0 in case of Ge (germanium), and a refractive index obtained by linear interpolation using a value of a mixed crystal ratio x is adopted in case of $Si_xGe_{1-x}$ where Si is 3.5 and Ge is 4.0.

When a central wavelength of the photonic bandgap formed of the oxide film and the SOI layer is close to the wavelength λ of the incident light, a heating distribution of the wafer in a layer thickness direction becomes non-uniform due to an influence of reflection even though the SOI layer surface is uniformly irradiated with a heating light (this non-uniformity does not necessarily occur in such a manner that the SOI layer side where reflection occurs has a low temperature as will be explained later in detail). When non-uniformity of a temperature of the base wafer in the layer thickness direction occurs, a radial heat stress of the base wafer also produces a distribution in the layer thickness direction and functions as a stress that generates, e.g., slip dislocation. In particular, when oxide precipitates are formed in the base wafer, it can be considered that many crystal defects, e.g., slip dislocations are introduced in a silicon single crystal bulk region constituting the wafer around the oxide precipitates.

Therefore, adjusting layer thicknesses of the oxide film and the SOI layer in such a manner that the central wavelength of the photonic bandgap formed of the laminated portion of the oxide film and the SOI layer becomes far from the peak wavelength λ of the incident light as much as possible enables effectively suppressing reflection of the heating light that is a factor of the non-uniformity of a temperature, and the reflectivity can be specifically set to 80% or below. However, setting the reflectivity to less than 30% is difficult in a current SOI wafer structure, and adopting this setting reduces a yield ratio, thereby increasing a cost.

As a result of a keen examination about this by the present inventor based on an experiment, the reflectivity can be set to the range of 30% to 80% by determining a refractive index of $SiO_2$ forming the oxide film in the wavelength region as n1 whilst determining a refractive index of a semiconductor forming the SOI layer in the wavelength region as n2, and respectively adjusting a thickness t1 of the oxide film and a thickness t2 of the SOI layer in such a manner that an optical thickness tOP of the oxide film and the SOI layer in the wavelength region becomes far from 0.5 λ as much as possible. Consequently, the SOI wafer can be uniformly heated based on light irradiation from the SOI layer side, and slip dislocation and others that occur in the SOI wafer during the epitaxial growth can be more effectively avoided.

Further, the above-explained effect of the present invention is particularly prominently demonstrated when heating during the epitaxial growth is performed by using a heating light source arranged on a first main surface side of the SOI layer, namely when heating is performed by using a so-called single-side heating type epitaxial growth apparatus. In such an epitaxial growth apparatus, a temperature of the base wafer is measured by a temperature sensor (e.g., a radiation temperature gauge) arranged on a second main surface side (a back surface side) of the base wafer, and a heating output from the heating light source is controlled to perform heating in such a manner that a temperature of the base wafer to be measured is increased to or held at a set heating temperature. At this time, when the SOI layer and the oxide film form the photonic bandgap structure, the following situation occurs.

That is, since a temperature of the base wafer detected by the temperature sensor is lower than a set temperature on an initial stage, an output from the heating light source is controlled to be increased, and a temperature starts to increase. However, since a large part of a coming heating light is reflected on the SOI layer side, a temperature detected on the second main surface side of the base wafer is hardly increased. As a result, a controller of the light source further increases an output of the heating light to approximate the detected temperature to a target value. That is, as compared with a case where reflection rarely occurs (e.g., when the epitaxial growth is performed with respect to a mirror-polished wafer or the like on which an SOI layer is not formed), an output from the heating light source is controlled to be excessive. On the other hand, heat transfer from the SOI layer surface to the base wafer side of course concerns not only radiant heat transfer based on direct incidence of the heating light but also heat transfer from an environmental atmosphere. Further, when the output from the heating light source is shifted to become excessive, a temperature in the environmental atmosphere that is not affected by reflection is abnormally increased, and a temperature on the SOI layer side that is in contact with this temperature is excessively increased, and a temperature difference between the front and back surfaces of the base wafer also becomes large. As a result, non-uniformity of a temperature of the SOI wafer is apt to further increase. However, when formation of the photonic bandgap in the laminated portion of the oxide film and the SOI layer is suppressed and the reflectivity on the surface is set to the range of 30% to 80% like the present invention, occurrence of slip dislocation and others on the SOI wafer can be effectively avoided even though the single-side heating type epitaxial growth apparatus is used.

This effect is particularly prominent when a heating set temperature is as high as the range of, e.g., 1000° C. to 1300° C. and a temperature-up speed to reach this set temperature is as high as the range of, e.g., 50° C./second to 100° C./second. That is, when the temperature-up speed is set to a high value, an output from the heating light source is increased before heat transfer in the thickness direction of the wafer does not sufficiently advances, and an increase in a temperature on the second main surface of the base wafer where a temperature is measured is further delayed with respect to a temperature on the SOI layer side. As a result, the output from the heating light source is apt to be further excessively intensified, and non-uniformity of a temperature readily occurs.

An embodiment according to the present invention will now be specifically explained hereinafter with reference to the accompanying drawings, but the present invention is not restricted thereto.

FIG. 1 is an explanatory drawing showing a method for manufacturing an SOI wafer in which a thickness of an SOI layer is increased by growing an epitaxial layer on the SOI layer in the SOI wafer serving as a substrate, and this shows a method for fabricating the SOI wafer serving as a substrate on which the epitaxial layer is grown based on a method for bonding two silicon wafers and then reducing a film thickness of the SOI layer by an ion implantation delamination method.

Here, although a process of fabricating the SOI wafer serving as the substrate on which the epitaxial layer is grown is based on the ion implantation delamination method, the present invention is not restricted to the ion implantation delamination method, and any method may be adopted to fabricate the wafer. For example, a method for implanting an oxygen ion into a silicon wafer and then performing a heat treatment (a SIMOX method) may be adopted, or an epitaxial wafer having a semiconductor single crystal, e.g., Si, SiGe, or Ge epitaxially grown on a silicon single crystal wafer may be used as a bond wafer. Further, the present invention can be also applied to a case where bonding is performed and then film thickness is reduced by, e.g., grinding to manufacture an SOI wafer.

First, at a step (a), two silicon mirror surface wafers are prepared, namely, a base wafer 14 serving as a support substrate and a bond wafer 11 serving as an SOI layer satisfying a specification of a device are prepared.

Then, at a step (b), at least one of the wafers, i.e., the bond wafer 11 in this example is thermally oxidized to form an oxide film 12 having a film thickness falling within the range of, e.g., 10 nm to 500 nm on a surface thereof. As formation of this oxide film, a method such as CVD can be adopted.

The film thickness of the oxide film 12 can be precisely adjusted based on an oxidation process temperature or time, an oxygen concentration in an atmosphere used for an oxidation process, and others in case of thermal oxidation. In this case, increasing the oxidation process temperature, prolonging the oxidation process time, and increasing the oxidation concentration in the atmosphere used for oxidation process contribute to an increase in the film thickness of the oxide film 12. This film thickness of the oxide film 12 becomes a film thickness t1 of an oxide film (a buried oxide film) 17 of an SOI wafer serving as a substrate fabricated at a later step (f) without change.

Then, at a step (c), at least one selected from an ion group including a hydrogen ion and a rare gas (He, Ne, Ar, Kr, or Xe) ion, which is the hydrogen ion in this example, is implanted into one surface of the bond wafer 11 to form an ion implanted layer 13 that is parallel to the surface at an average penetration depth of the ion.

A depth of the ion implanted layer 13 can be set to a value falling within the range of, e.g., 20 nm to 2000 nm, and it can be precisely adjusted based on, e.g., an ion implantation energy. In this case, increasing the ion implantation energy contributes to increasing the depth of the ion implanted layer 13. This depth of the ion implanted layer 13 directly concerns determining a film thickness of an SOI layer 18 of the SOI wafer that is fabricated at a later step (f), and it is substantially equal to a sum of the film thickness of the oxide film 17 and the film thickness of the SOI layer 18 immediately after delamination.

Subsequently, a step (d) is a process of overlapping and contacting a hydrogen ion implanted surface of the bond wafer 11 in which the hydrogen ion is implanted with the base wafer 14 through the oxide film. When the surfaces of the two wafers are brought into contact with each other in a clean atmosphere at an ordinary temperature, the wafers can be bonded to each other without using, e.g., an adhesive.

Then, a step (e) is a delamination heat treatment process of performing delamination with the ion implanted layer 13 as a boundary to separate a delaminated wafer 15 and an SOI wafer 16. For example, when a heat treatment is applied in, e.g., an inert gas atmosphere at a temperature of approximately 400 to 600° C., the delaminated wafer 15 and the SOI wafer 16 are separated based on rearrangement of crystals and agglomeration of air bubbles. It is to be noted that the delamination heat treatment may be omitted by increasing an ion implantation amount when forming the delamination ion implanted layer 13 or previously carrying out a plasma treatment with respect to the surfaces to be overlapped in order to activate the surfaces. Further, the delaminated wafer 15 can be reused as a bond wafer or a base wafer after polishing its delaminated surface.

After the delamination process, a bonding heat treatment process is carried out at a step (f). At this step, since a bonding force of the wafers that are closely contacted with each other in the contacting process and the delamination heat treatment process at the steps (d) and (e) is weak when it is used in a device process as it is, a heat treatment at a high temperature is performed with respect to the SOI wafer 16 as the bonding heat treatment to obtain sufficient bonding strength. This heat treatment is performed in, e.g., an inert gas atmosphere at 1000 to 1200° C. in the range of 30 minutes to 2 hours.

In this case, the delamination heat treatment may be performed at a high temperature of, e.g., 800° C. or above so that this heat treatment can also function as the bonding heat treatment, and the bonding heat treatment that is solely performed may be omitted.

Furthermore, after this process, in order to remove a damaged layer on the surface of the SOI layer 18, i.e., the delaminated surface produced due to ion implantation at the step (c), polishing with a very small polishing stock removal which is so-called touch polishing or so-called sacrificial oxidation of removing the oxide film generated after the oxidation heat treatment by etching may be carried out.

Performing the above-explained processes enables fabricating an SOI wafer 19 serving as a substrate that includes the oxide film 17 and the SOI layer 18 and is used to perform the epitaxial growth on the SOI layer 18.

Subsequently, a step (g) is a process for performing the epitaxial growth on the SOI layer of the SOI wafer serving as a substrate to manufacture an SOI wafer having an SOI layer with a desired thickness.

This epitaxial growth is carried out by using, e.g., such a single-wafer processing type vapor phase epitaxial growth apparatus as depicted in FIG. 2. This epitaxial growth apparatus 30 is an apparatus that carries out processing including heating with respect to each wafer to perform vapor phase epitaxial growth on a main surface of a substrate, e.g., a silicon single crystal wafer (a wafer W).

The epitaxial growth apparatus 30 mainly includes an epitaxial growth container 31, a susceptor 32 on which the wafer W is mounted, supporting means 33 for supporting the susceptor 32, temperature measuring means 34, a heater 35 that heats the wafer W, and others. The epitaxial growth container 31 is used to perform the epitaxial growth with the wafer W arranged therein, and a top wall 31a and a bottom wall 31b thereof are formed of translucent quartz. Moreover, a gas supply opening 31c through which a reactant gas is supplied into the epitaxial growth container 31 and a gas exhaust opening 31d through which the reactant gas is exhausted from the epitaxial growth container 31 are formed in a side wall of the heat treatment container 31.

The susceptor 32 is provided in the epitaxial growth container 31, and formed by coating graphite with a silicon carbide. A substantially circular counter bore 32a on which the wafer W is mounted is formed on an upper surface of the susceptor 32. The supporting means 33 is formed of a rotary shaft 33a extended in a vertical direction below the susceptor 32 (non-illustrated rotation driving means is coupled with the rotary shaft 33a) and a spoke 33b that radially branches from an upper end portion of the rotary shaft 33a toward an oblique upper side and has distal end portions supporting a lower surface of the susceptor 32. On a back surface of the susceptor 32, non-illustrated hollow portions are formed at positions with which the distal end portions of the spoke 33a of the supporting means 33 come into contact. When the distal end portions of the spoke 33b are fitted in the hollow portions, the susceptor 32 is fixed on the supporting means 33.

In this embodiment, heating for the epitaxial growth is carried out based on rapid heating having a temperature-up speed to reach an epitaxial growth temperature being set to the range of 50° C./second to 100° C./second, e.g., 75° C./second. The SOI wafer is arranged on an upper side in such a manner that the SOI layer faces a heating lamp 35. A heating light emitted from the heating lamp 35 is, e.g., a near-infrared ray having a peak wavelength $\lambda$ of 1000 nm.

A reaction temperature of the epitaxial growth falls within the range of, e.g., 900° C. to 1200° C. in case of silicon. Further, a reaction time of the epitaxial growth falls within the range of, e.g., 30 seconds to 30 minutes. Although the reaction time may be long, productivity is reduced in such a case. Furthermore, a film thickness of an epitaxial layer can be adjusted based on a flow volume, a reaction temperature, and a reaction time of the reactant gas.

An epitaxial layer 20 after the epitaxial growth and the SOI layer 18 before the epitaxial growth form an SOI layer of an SOI wafer 21 after the epitaxial growth.

In this manner, the SOI wafer 21 having the SOI layer with a desired film thickness is manufactured.

Meanwhile, as explained above, the thickness t1 of the oxide film 17 is determined at the step (h). Furthermore, since delamination is performed at the step (e) at the ion implantation depth determined based on the ion implantation energy used in ion implantation at the step (c), the thickness t2 of the SOI layer 18 immediately after delamination is determined at the step (c). That is, appropriately adjusting the conditions at the step (b) and the step (c) enables adjusting the thicknesses, i.e., the thickness t1 of the oxide film 17 and the thickness t2 of the SOI layer 18.

Although the description has been given as to the method for adjusting the thickness t1 of the oxide film 17 and the thickness t2 of the SOI layer 18 when fabricating the SOI wafer serving as a substrate based on the ion implantation delamination method, the thickness t1 of the oxide film and the thickness t2 of the SOI layer can be likewise adjusted by an appropriate method when fabricating an SOI wafer serving as a substrate on which an epitaxial layer is grown based on any other method. For example, in a SIMOX method, adjusting, e.g., an implantation energy when implanting an oxygen ion enables adjusting the thickness t1 of the oxide film and the thickness t2 of the SOI layer.

It is to be noted that, when the respective layer thicknesses t1 and t2 and the refractive indices n1 and n2 of both the layers are determined, wavelength dependence of a reflectivity of the laminated portion can be simulated by using calculation based on a photonic bandgap theory.

That is, the present invention is characterized in that the laminated portion of the oxide film 17 and the SOI layer 18 is preferably prevented from forming the one-dimensional photonic bandgap structure, i.e., that the layer thickness t1 of the silicon oxide film 17 and the layer thickness t2 of the SOI layer 18 are adjusted in such a manner that the total tOP of the optical thicknesses of both the layers becomes far from 0.5 λ as the photonic bandgap forming condition. Satisfying such a layer thickness relationship at the time of start of the epitaxial growth enables suppressing a defect density of, e.g., slip dislocation on the SOI wafer after the epitaxial growth. It can be considered that having a predetermined reflectivity at the start of the epitaxial growth affects a quality of the SOI wafer after the epitaxial growth because the epitaxial layer non-uniformly grows and uniformity cannot be corrected in a subsequent growth process if a radial temperature is non-uniform at the start of growth.

EXAMPLE 1

The present invention will now be more specifically explained with reference to examples of the present invention, but the present invention is not restricted thereto.

A method for fabricating an SOI wafer serving as a substrate based on the ion implantation delamination method will now be explained with reference to FIG. 1.

Four thin discoid wafers each formed of a CZ silicon single crystal substrate (a diameter: 200 mm (8 inches), a thickness: 625 μm) having an oxygen concentration of 20 ppma were prepared, and two wafers were determined as bond wafers whilst two wafers were determined as base wafers.

Then, the two bond wafers were subjected to a heat treatment in an oxidizing atmosphere to form an oxide film on an entire surface of each wafer. At this time, a time of the heat treatment was adjusted to set a thickness of the oxide film to 145 nm. A hydrogen ion was implanted into each of the two bond wafers under conditions where an implantation depth was set to 195 nm or 215 nm by determining a dose amount to $10\times10^{16}/cm^2$ and adjusting an implantation energy.

Subsequently, two SOI wafers serving as substrates were prepared in accordance with the steps (d), (e), and (f) in FIG. 1. A combination of a thickness t1 of the oxide film and a thickness t2 of an SOI layer in each of these SOI wafers was 145 nm/50 nm or 145 nm70 nm.

Reflectivities of these SOI wafers were measured. FIG. 4 shows its result. The reflectivities were 76% and 80% near 1000 nm where a light quantity obtained by a heating lamp becomes maximum.

Then, such a single-wafer processing type vapor phase epitaxial growth apparatus as shown in FIG. 2 was used to grow an epitaxial layer on the SOI layer of each SOI wafer serving as the substrate. A reaction temperature was set to 1050° C., and a reaction time was set to 30 seconds. A film thickness of the epitaxial layer in each of the SOI wafers was 1000 nm, and a combination of a total film thickness of the SOI layer and a thickness of the oxide film after the epitaxial growth was 1050 nm/145 nm or 1070 nm/145 nm.

A total slip length of each SOI wafer subjected to the epitaxial growth in this manner was measured, and the result was 5 mm or 30 mm.

EXAMPLE 2/COMPARATIVE EXAMPLE

Then, seven SOI wafers each of which has a surface reflectivity of 30% to 95% by adjusting a thickness of an oxide film and a thickness of an SOI layer based on the same method as that in Example 1 (an implantation depth: 215 nm) and becomes a substrate were prepared. An epitaxial layer having a thickness of 1000 nm was grown on an SOI of each SOI wafer serving as a substrate under conditions of 1050° C. as a reaction temperature and 30 seconds as a reaction time, thereby manufacturing each SOI wafer.

FIG. 5 shows a relationship between a total slip length measured after the epitaxial growth and a reflectivity of the SOI wafer before the epitaxial growth. Although the total slip length may possibly exceed 100 mm as an allowable value in the SOI wafer having the reflectivity exceeding 80%, the total slip length is equal to or below the allowable value in the SOI wafer having the reflectivity of 80% or below, and this length is substantially zero in especially the wafer having the reflectivity of 70% or below. All the SOI wafers each having the reflectivity of 60% or below have the total slip lengths, which are substantially zero.

It is to be noted that the present invention is not restricted to the foregoing examples. The foregoing examples are just exemplifications, and any examples that have substantially the same structures as the technical concept explained in claims of the present invention and demonstrate the same functions and effects are included in the technical scope of the present invention.

The invention claimed is:

1. A method for manufacturing an SOI wafer in which a thickness of an SOI layer is increased by growing an epitaxial layer on the SOI layer of the SOI wafer having an oxide film and the SOI layer formed on a base wafer, wherein the epitaxial growth is performed by single-side heating using a heating light source arranged on one side of the SOI layer in such a manner that a reflectivity of a surface of the SOI wafer on which the epitaxial layer is grown in a wavelength region of a heating light at the start of the epitaxial growth falls within the range of 30% to 70% by adjusting the thickness of the oxide film and the thickness of the SOI layer, respectively.

2. The method for manufacturing an SOI wafer according to claim 1, wherein the SOI wafer on which the epitaxial layer is grown is fabricated by ion-implanting a hydrogen ion, a rare gas ion, or a mixed gas containing these ions from a surface of a bond wafer to form an ion implanted layer in the wafer, closely contacting an ion implanted surface of the bond wafer with a surface of the base wafer through the oxide film, and then performing a heat treatment to delaminate the bond wafer in a thin film with the ion implanted layer being used as a cleavage plane.

* * * * *